US009859396B2

(12) United States Patent
Hilsenbeck et al.

(10) Patent No.: US 9,859,396 B2
(45) Date of Patent: Jan. 2, 2018

(54) METHODS FOR FORMING A PLURALITY OF SEMICONDUCTOR DEVICES ON A PLURALITY OF SEMICONDUCTOR WAFERS

(71) Applicant: Infineon Technologies AG, Neubiberg (DE)

(72) Inventors: Jochen Hilsenbeck, Villach (AT); Jens Peter Konrath, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/162,778

(22) Filed: May 24, 2016

(65) Prior Publication Data

US 2016/0359014 A1    Dec. 8, 2016

(30) Foreign Application Priority Data

Jun. 2, 2015  (DE) .................. 10 2015 108 703

(51) Int. Cl.
*H01L 21/00*  (2006.01)
*H01L 29/66*  (2006.01)
(Continued)

(52) U.S. Cl.
CPC ...... *H01L 29/66143* (2013.01); *H01L 21/265* (2013.01); *H01L 21/8232* (2013.01);
(Continued)

(58) Field of Classification Search
CPC ................... H01L 29/66143; H01L 21/265
(Continued)

(56) References Cited

U.S. PATENT DOCUMENTS 4,418,470 A * 12/1983 Naster .................. H01L 21/764
                                                        257/352
4,738,937 A *  4/1988 Parsons ................ H01L 29/456
                                                        257/E29.146
(Continued)

FOREIGN PATENT DOCUMENTS

JP     S61-203672     9/1986
JP     H9-260591      3/1997
JP     H11-214410     6/1999

OTHER PUBLICATIONS

Office Action communication of the German Patent and Trademark Office for Appln. Ser. No. 102015108703.0, dated Apr. 3, 2016.
(Continued)

*Primary Examiner* — Jami M Valentine
(74) *Attorney, Agent, or Firm* — Baker Botts L.L.P.

(57) ABSTRACT

A method for forming a plurality of semiconductor devices on a plurality of semiconductor wafers includes forming an electrically conductive layer on a surface of a first semiconductor wafer so that a Schottky-contact is generated between the electrically conductive layer formed on the first semiconductor wafer and the first semiconductor wafer. The method further includes forming an electrically conductive layer on a surface of a second semiconductor wafer so that a Schottky-contact is generated between the electrically conductive layer formed on the second semiconductor wafer and the second semiconductor wafer. A material composition of the electrically conductive layers formed on the first and second semiconductor wafers are selected based on a value of the physical property of the first and second semiconductor wafers, respectively. The material composition of the electrically conductive layers formed on the first and second semiconductor wafers are different.

18 Claims, 3 Drawing Sheets

(51) Int. Cl.
*H01L 27/08* (2006.01)
*H01L 21/8232* (2006.01)
*H01L 21/265* (2006.01)
*H01L 21/66* (2006.01)
*H01L 21/04* (2006.01)
*H01L 29/47* (2006.01)

(52) U.S. Cl.
CPC .............. *H01L 22/10* (2013.01); *H01L 22/20* (2013.01); *H01L 27/0814* (2013.01); *H01L 21/0495* (2013.01); *H01L 29/47* (2013.01); *H01L 29/475* (2013.01); *H01L 29/6606* (2013.01); *H01L 29/66212* (2013.01)

(58) Field of Classification Search
USPC .......................................................... 438/5
See application file for complete search history.

(56) References Cited

U.S. PATENT DOCUMENTS

| | | | | |
|---|---|---|---|---|
| 5,672,214 A | * | 9/1997 | Arthur | ............ H01L 31/022466 136/250 |
| 5,929,523 A | * | 7/1999 | Parsons | ............... H01L 21/0485 257/750 |
| 2001/0026699 A1 | | 10/2001 | Ishikura | |
| 2006/0273396 A1 | * | 12/2006 | Anda | .................. H01L 21/7605 257/350 |
| 2015/0262889 A1 | | 9/2015 | Yamashita | |

OTHER PUBLICATIONS

Office Action communication of the Japanese Patent and Trademark Office for Appln. Ser. No. 2016-111057, dated May 15, 2017.

* cited by examiner

METHODS FOR FORMING A PLURALITY OF SEMICONDUCTOR DEVICES ON A PLURALITY OF SEMICONDUCTOR WAFERS

CROSS-REFERENCE TO RELATED APPLICATION

This application claims priority to German Application Serial No. 102015108703.0 filed Jun. 2, 2015 and entitled "Method for Forming a Plurality of Semiconductor Devices on a Plurality of Semiconductor Wafers."

FIELD

Embodiments relate to the manufacturing of semiconductor devices and in particular to methods for forming a plurality of semiconductor devices on a plurality of semiconductor wafers.

BACKGROUND

Diodes, e.g., Schottky-diodes using the Schottky-effect, may be used to switch high currents or high power. A quantity to determine a diode's switching efficiency is its forward voltage. A high forward voltage may mean a high power loss at the diode. In order to minimize power loss, a contact surface between the Schottky-metal and the semiconductor material may be increased for a single diode or a plurality of diodes may be connected in parallel. For example, to ensure an equal distribution of current or power among the plurality of parallel connected diodes, the device characteristics of the diodes (e.g. their forward voltage) should be equal. However, with conventional manufacturing processes variations of the device characteristics (e.g. variations of the forward voltage of the diodes formed on a batch, a loss or a larger quantity of semiconductor wafers) are present. Accordingly, heterogeneous loads may be applied to the individual diodes of the plurality diodes causing deterioration or failure of individual diodes.

SUMMARY

There may be a demand for a manufacturing process enabling a more uniformly distributed forward voltage of the manufactured semiconductor diodes. In general, there may be a demand for a manufacturing process enabling more uniformly distributed device characteristics of the manufactured semiconductor devices.

The demand may be satisfied by subject-matter according to the enclosed claims.

Some embodiments relate to a method for forming a plurality of semiconductor devices on a plurality of semiconductor wafers. The method comprises forming an electrically conductive layer on a surface of a first semiconductor wafer so that a Schottky-contact is generated between the electrically conductive layer formed on the first semiconductor wafer and the first semiconductor wafer. A material composition of the electrically conductive layer formed on the first semiconductor wafer is selected based on a value of a physical property of the first semiconductor wafer. The method further comprises forming an electrically conductive layer on a surface of a second semiconductor wafer so that a Schottky-contact is generated between the electrically conductive layer formed on the second semiconductor wafer and the second semiconductor wafer. A material composition of the electrically conductive layer formed on the second semiconductor wafer is selected based on a value of the physical property of the second semiconductor wafer. The material composition of the electrically conductive layer formed on the second semiconductor wafer is different from the material composition of the electrically conductive layer formed on the first semiconductor wafer.

Some embodiments relate to a method for forming a plurality of semiconductor devices on a plurality of semiconductor wafers. The method comprises removing impurities from a surface of a first semiconductor wafer by a back sputter process applied to the surface of the first semiconductor wafer. A process time of the back sputter process applied to the surface of the first semiconductor wafer is selected based on a value of a physical property of the first semiconductor wafer. The method further comprises removing impurities from a surface of a second semiconductor wafer by a back sputter process applied to the surface of the second semiconductor wafer. A process time of the back sputter process applied to the surface of the second semiconductor wafer is selected based on a value of the physical property of the second semiconductor wafer. The process time of the back sputter process applied to the surface of the first semiconductor wafer is different from the process time of the back sputter process applied to the surface of the second semiconductor wafer.

Some embodiments relate to a method for forming a plurality of semiconductor devices on a plurality of semiconductor wafers. The method comprises implanting ions into a first semiconductor wafer. A concentration of the ions implanted into the first semiconductor wafer is selected based on a value of a physical property of the first semiconductor wafer. The method further comprises implanting ions into a second semiconductor wafer. A concentration of the ions implanted into the second semiconductor wafer is selected based on a value of the physical property of the first semiconductor wafer. The concentration of the ions implanted into the first semiconductor wafer is different from the concentration of the ions implanted into the second semiconductor wafer.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art, unless expressly defined otherwise herein.

Figure 1:
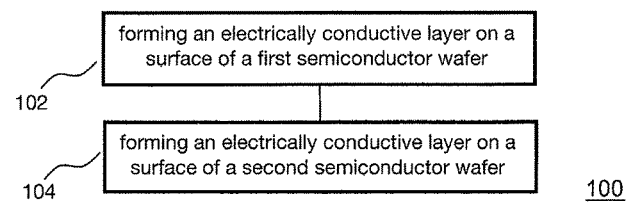
FIG. 1 illustrates a flowchart of a method for forming a plurality of semiconductor devices on a plurality of semiconductor wafers.

FIG. 1 illustrates a flowchart of an embodiment of a method 100 for forming a plurality of semiconductor devices on a plurality of semiconductor wafers.

The method 100 comprises forming 102 an (first) electrically conductive layer on a surface of a first semiconductor wafer so that a Schottky-contact is generated between the electrically conductive layer formed on the first semiconductor wafer and the first semiconductor wafer. A material composition of the electrically conductive layer formed on the first semiconductor wafer is selected based on a value of a physical property of the first semiconductor wafer.

The method 100 further comprises forming 104 an (further or second) electrically conductive layer on a surface of a second semiconductor wafer so that a Schottky-contact is generated between the electrically conductive layer formed on the second semiconductor wafer and the second semiconductor wafer. A material composition of the electrically conductive layer formed on the second semiconductor wafer is selected based on a value of the physical property of the second semiconductor wafer.

The material composition of the electrically conductive layer formed on the second semiconductor wafer is different from the material composition of the electrically conductive layer formed on the first semiconductor wafer.

The different material compositions of the electrically conductive layer formed on the first semiconductor wafer and of the electrically conductive layer formed on the second semiconductor wafer may allow to individually adjust a Schottky-barrier of the Schottky-contact generated between the electrically conductive layer formed on the first semiconductor wafer and the first semiconductor wafer and a Schottky-barrier of the Schottky-contact generated between the electrically conductive layer formed on the second semiconductor wafer and the second semiconductor wafer. Adjusting the Schottky-barrier of the Schottky-contact individually for each semiconductor wafer may allow to compensate for variations among the plurality of semiconductor wafers. For example, the value of the physical property may indicate variations among the plurality of semiconductor wafers. Adjusting the Schottky-barrier of the Schottky-contact individually for each semiconductor wafer may allow a more uniform distribution of device characteristics of the semiconductor devices formed on a batch, a loss or a larger quantity of semiconductor wafers.

A semiconductor device formed according to the proposed concept may be any electrical device comprising a semiconductor material or semiconductor die implementing an electrical functionality using at least one Schottky-contact. The semiconductor device may, e.g., be a semiconductor diode. In some embodiments, the semiconductor device may be a Schottky-diode. A Schottky-diode may be a diode comprising a Schottky-contact. The semiconductor devices formed on the first semiconductor wafer or any other semiconductor wafer out of the plurality of semiconductor wafers may be substantially equal to semiconductor devices formed on the second semiconductor wafer. For example, a structure or one or more device characteristics may be equal for the semiconductor devices apart from minor variations related to the manufacturing process.

Silicon (Si), germanium (Ge), silicon carbide (SiC), gallium nitride (GaN) or gallium arsenide (GaAs) may for example be used as semiconductor material. Alternatively, various other elementary semiconductor materials or semiconductor compounds may be used. In some embodiments, the semiconductor material may be doped with one or more dopants like boron (B), arsenic (As), nitrogen (N), phosphorus (P), antimony (Sb), aluminum (Al), sulfur (S), selenium (Se), tellurium (Te), magnesium (Mg), cadmium (Cd) or various other elements or compounds. The dopants may be incorporated into the semiconductor material by suitable process (e.g. ion implantation or diffusion). A concentration of the dopants (e.g. an average amount of dopants within a defined volume of the semiconductor material) may be selected based on desired electrical properties of the semiconductor device.

A semiconductor wafer used for forming semiconductor devices may be a structural component including at least one layer of semiconductor material. The semiconductor material of the semiconductor wafer may be doped with one or more dopants or may be un-doped. Different layers of the semiconductor wafer may have different dopant concentrations and may comprise different dopants.

The semiconductor material of the one or more layers may be provided on a carrier. For example, the one or more layers of semiconductor material may be grown on the carrier by epitaxial processes. The carrier may, e.g., comprise or consist of silicon (Si), silicon carbide (SiC), silicon nitride (SiN), molybdenum (Mo), tantalum (Ta), tantalum carbide ($TaC_x$), tungsten (W), sapphire ($Al_2O_3$), graphite (C), carbon (C), ternary carbide or ternary nitride or a combination of two or more of these materials.

The semiconductor wafer or the carrier may comprise a substantially circular shape. The semiconductor material of the semiconductor wafer may comprise defined dimensions (e.g. a thickness of substantially 150 mm, 200 mm, 300 mm, 450 mm or more).

Forming the plurality of semiconductor devices on the first semiconductor wafer comprises forming the electrically conductive layer on the surface (e.g. a main surface or a front side surface) of the first semiconductor wafer. A lateral extension of the semiconductor wafer may be in parallel to a main surface or front side surface of the semiconductor wafer and a vertical direction may be orthogonal to the main surface or front side surface of the semiconductor wafer. Semiconductor material may be deposited on the main surface or front side surface of the semiconductor wafer.

Forming an electrically conductive layer on the surface of a semiconductor wafer of the plurality of semiconductor wafers may include forming the electrically conductive layer directly on the surface of the semiconductor wafer. For example, no further layer may be provided between the surface of the semiconductor wafer and the electrically conductive layer.

Forming an electrically conductive layer on the surface of a semiconductor wafer of the plurality of semiconductor wafers may include any suitable process for depositing the electrically conductive layer on the semiconductor wafer (e.g. vapor deposition or a sputter process). For example, the electrically conductive layer is a layer having the ability to conduct an electric current. An electrically conductive layer may comprise one or more elements or compounds (e.g. a metal element like Mo or W; or a combination of metal and semiconductor like W and Si; or a combination of metal and nitrogen like TiN, MoN) resulting in an electrically conducting material (e.g. a metal or an alloy).

An electrically conductive layer formed on the surface of a semiconductor wafer of the plurality of semiconductor wafers may have a thickness between 100 nm (or 400 nm) and 5 µm, for example. For example, the electrically conductive layer may have a thickness of 100 nm, 200 nm, 400 nm, 600 nm, 800 nm, 1 µm, 1.2 µm, 1.8 µm, 2.4 µm, 2.6 µm, 3.1 µm, 3.7 µm or 4.5 µm. The electrically conductive layer may have substantially equal thickness on the semiconductor wafer.

The material of the electrically conductive layer formed on a semiconductor wafer of the plurality of semiconductor wafers (e.g. the first semiconductor wafer or the second semiconductor wafer) is selected or adjusted based on a physical property of the semiconductor wafer. For example, the physical property of the semiconductor wafer is a property suitable for indicating variations of desired physical or electrical characteristics among the plurality of semiconductor wafers.

For example, the physical property of the first semiconductor wafer may be a thickness of the first semiconductor wafer (e.g. a vertical extension of the semiconductor wafer). In some embodiments, a thickness of a single layer out of plural layers of the semiconductor wafer may be used as physical property (e.g. a thickness of an epitaxial layer at a front surface of the semiconductor wafer). Also a combined or weighted thickness of more than one layer of plural layers of the semiconductor wafer may be used as physical property. Alternatively, the physical property may be a dopant concentration of the semiconductor wafer, a dopant concentration of a layer (e.g. an epitaxial layer at a front surface of the semiconductor wafer) of the semiconductor wafer or a combined or weighted dopant concentration of more than one layer out of plural semiconductor layers of the semiconductor wafer. For example, the dopant concentration may be an average concentration of dopants within the semiconductor wafer, within the layer of the semiconductor wafer or within the more than one layers of the semiconductor wafer. In some embodiments, the physical property of the first semiconductor wafer may be a sheet resistance of the semiconductor wafer (e.g. a resistance of the semiconductor wafer that is substantially invariable under scaling of the measuring contact). Alternatively or additionally, combinations of physical properties of the semiconductor wafer may be used to characterize the semiconductor wafer.

The value of the physical property may be known for the first and/or the second the semiconductor wafer (e.g. for all semiconductor wafers of the plurality of semiconductor wafers). For example, a manufacturer of the semiconductor wafer may provide values of the physical property for the provided semiconductor wafers. In some embodiments, the method may comprise determining (measuring) the value of the physical property of the semiconductor wafer. For example, a common four-point probe measurement or an indirect measurement using a non-contact eddy current may be used to determine a value of the semiconductor wafer's sheet resistance. For determining the thickness of the semiconductor wafer or the thickness of a layer of the semiconductor wafer as well as for determining a dopant concentration of the semiconductor wafer or a dopant concentration of a layer of the semiconductor wafer various measuring techniques may be used. For example, secondary ion mass spectrometry, capacitance-voltage spectrometry or cross-section analysis may be used to determine values of the thickness of the semiconductor wafer, the thickness of a layer of the semiconductor wafer, a dopant concentration of the semiconductor wafer or a dopant concentration of a layer of the semiconductor wafer.

The value of the physical property is used to select a (first) material composition for the electrically conductive layer formed on the first semiconductor wafer and a (second) material composition for the electrically conductive layer formed on the second semiconductor wafer and so on. The material composition for the electrically conductive layer formed on the first semiconductor wafer may provide a predefined Schottky-barrier of the Schottky-contact generated between the electrically conductive layer formed on the first semiconductor wafer and the first semiconductor substrate. The material composition for the electrically conductive layer formed on the second semiconductor wafer may provide another (different) predefined Schottky-barrier of the Schottky-contact generated between the electrically conductive layer formed on the second semiconductor wafer and the second semiconductor wafer. Accordingly, the Schottky-barrier may be adjusted based on the characteristics of the respective semiconductor wafer, for example.

For example, a first material composition of the electrically conductive layer for the first semiconductor wafer may be selected for a first value of the physical property of the first semiconductor wafer and a second material composition different from the first material composition may be selected for a second value of the physical property, if the second value of the physical property is different from the first value of the physical property.

Accordingly, a material composition of an electrically conductive layer formed on a semiconductor wafer may be adjusted according to an actual characteristic of the respective semiconductor wafer, which is given by the value of the physical property.

For example, a portion of one or more components of the material composition of an electrically conductive layer formed on a semiconductor wafer of the plurality of semiconductor wafers may be selected or adjusted based on the value of the physical property. Selecting or adjusting the portion of the one or more components of the material composition may allow to effectively adjust the Schottky-barrier of the Schottky-contact between the electrically conductive layer and the semiconductor substrate of the semiconductor wafer.

The material composition of the electrically conductive layer formed on the first semiconductor wafer and the material composition of the electrically conductive layer formed on the second semiconductor wafer may in some embodiments comprise at least one same component or compound. For example, the material composition of the electrically conductive layer formed on the first semiconductor wafer may comprise the same elements like the material composition of the electrically conductive layer formed on the second semiconductor wafer in a different proportion. The actual proportions of the one or more elements for the electrically conductive layer formed on the first semiconductor wafer and for the electrically conductive layer formed on the second semiconductor wafer may be selected based on the actual values of the physical property of the first semiconductor wafer and the second semiconductor wafer, respectively.

In some embodiments, a portion of at least one component of the material composition of the electrically conductive layer formed on the first semiconductor wafer may differ by at least 4%, 5%, 6%, 7%, 8%, 9%, 10% or more from a portion of the component in the material composition of the electrically conductive layer formed on the second semiconductor wafer. Varying a portion of at least one component of the material compositions for the electrically conductive layers formed on the first semiconductor wafer and the second semiconductor wafer may allow to efficiently adjust the Schottky-barrier of the Schottky-contact for the respective semiconductor wafer.

The material composition of the electrically conductive layer formed on a semiconductor wafer of the plurality of semiconductor wafers (e.g. on the first semiconductor wafer or the second semiconductor wafer) may comprise at least two different materials or elements. For example, the material composition of the electrically conductive layer formed on the semiconductor wafer may comprise an alloy of two or more metal elements (e.g. a titanium tungsten (TiW) alloy). In some embodiments, the material composition of the electrically conductive layer may comprise a composition comprising a metal element and a non-metal element (e.g. tungsten silicide ($WSi_2$) or metal nitrogen compounds like titanium nitride (TiN), molybdenum nitride (MoN) or tungsten nitride ($W_2N$, WN, $WN_2$)). The material composition of the electrically conductive layer may in some embodiments comprise a composition comprising a metal element, a semiconductor element and a non-metal element (e.g. a composition comprising a metal element, nitrogen and a semiconductor element (e.g. WSiN)).

The above examples of material (elements) for the material composition of the electrically conductive layer may allow to adjust the Schottky-barrier of the Schottky-contact between the electrically conductive layer and the semiconductor substrate. For example, a proportion of one or more of the above example materials within the material composition may be selected or adjusted to achieve a desired Schottky-barrier or a desired level of the Schottky-barrier.

In some embodiments, the electrically conductive layer for, e.g., the first semiconductor wafer comprises nitrogen. A concentration of nitrogen of the electrically conductive layer formed on the first semiconductor wafer may be selected based on the value of the physical property of the first semiconductor wafer. Varying the concentration of nitrogen may allow to adjust the Schottky-barrier of the Schottky-contact within, e.g., a range of several hundreds of milli-electron-volt (meV). For example, the Schottky-barrier may be adjusted between 800 meV and 1300 meV, 1000 meV and 1200 meV, or 900 meV and 1100 meV. For example, the electrically conductive layer may comprise MoN and a concentration of nitrogen of the MoN may be selected or adjusted to adjust the Schottky-barrier of the Schottky-contact. The concentration of nitrogen of the MoN may, e.g., be selected or adjusted from 0% to 10% (e.g. between 1%-8%, 2%-6% or 3%-9%) based on the physical property of the semiconductor wafer. In some embodiments, the electrically conductive layer may comprise metal-nitrogen compounds (e.g. TiN), metal-nonmetal compounds (e.g. WSi), for example, TiN, MoN, $W_xN_x$ or the like having a selected concentration of nitrogen.

Forming the electrically conductive layer on a semiconductor wafer of the plurality of semiconductor wafers (e.g. forming 102 the electrically conductive layer on the first semiconductor wafer or forming 104 the electrically conductive layer on the second semiconductor wafer) may in some embodiments comprise a sputter process. Various different sputter processes may be used for depositing the electrically conductive layer on the semiconductor wafer. For example, ion-beam sputtering, high-power impulse magnetron sputtering or gas flow sputtering may be used.

For example, the electrically conductive layer comprising nitrogen may be formed by a sputter process using a sputter gas containing nitrogen. The concentration of nitrogen in the electrically conductive layer formed on the semiconductor wafer may selected by adjusting a partial pressure of nitrogen in the sputter gas. Increasing the partial pressure of nitrogen in the sputter gas may allow to increase the concentration of nitrogen of the electrically conductive layer. Accordingly, the Schottky-barrier of the Schottky-contact may be lowered by increasing the concentration of nitrogen of the electrically conductive layer (e.g. by increasing the partial pressure of nitrogen in the sputter gas), for example. For example, a Schottky-barrier of approx. 1300 meV may be adjusted for a partial pressure of nitrogen of zero, a Schottky-barrier of approx. 1100 meV may be adjusted for a partial pressure of nitrogen of 10% in a sputter gas containing nitrogen and argon, a Schottky-barrier of approx. 1000 meV may be adjusted for a partial pressure of nitrogen of 40% in a sputter gas containing nitrogen and argon, or a Schottky-barrier of approx. 900 meV may be adjusted for a partial pressure of nitrogen of 60% in a sputter gas containing nitrogen and argon.

In some embodiments, the material composition of the electrically conductive layer formed on the first semiconductor wafer and the material composition of the electrically conductive layer formed on the second semiconductor wafer may be selected such that a Schottky-barrier of the Schottky-contact between the electrically conductive layer formed on the first semiconductor wafer and the first semiconductor wafer differs by at least 4%, 5%, 6%, 7%, 8%, 9%, 10% or more from a Schottky-barrier of the Schottky-contact between the electrically conductive layer formed on the second semiconductor wafer and the second semiconductor wafer.

In some embodiments, the method 100 may further comprise purifying the surface of a semiconductor wafer of the plurality of semiconductor wafers (e.g. the first semiconductor wafer of the second semiconductor wafer) by a back sputter process before forming the electrically conductive layer formed on the semiconductor wafer. Impurities may be impurity atoms like oxygen or chemical compounds which deposited on the surface of the semiconductor wafer. The back sputter process may allow to remove at least part or almost all impurities from the surface of the semiconductor wafer before the electrically conductive layer is formed on the surface. A process time of the back sputter process may be selected based on the value of the physical property of the semiconductor wafer. Selecting the process time (e.g. a time interval during which particles or ions are accelerated onto the surface of the semiconductor wafer) may allow to select a degree of purification (e.g. a fraction of impurities that is removed from the surface of the semiconductor wafer). Removing impurities from the surface of the semiconductor wafer (e.g. the contact surface for the Schottky-contact) may allow to adjust the Schottky-barrier of the Schottky-contact.

Alternatively or additionally, the sputter gas used for the back sputter process may be selected based on the value of the physical property of the semiconductor wafer. For example, inert gases like helium (He), neon (Ne), argon (Ar), krypton (Kr) or xenon (Xe), or fluorine (F) may be used as sputter gas. The selected inert gas may affect the power of the back sputter process (e.g. a fraction of impurities that is removed from the surface of the semiconductor wafer).

A semiconductor of the plurality of the semiconductor devices may comprise a breakdown or blocking voltage of more than 10V (e.g. a breakdown voltage of 10 V, 20 V or 50V) 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V or 2000V, or 3.3 kV or 6.5 kV).

In some embodiments, the semiconductor devices of the plurality of semiconductor devices may be Schottky-diodes. Adjusting the Schottky-barrier of the Schottky-contact individually for each semiconductor wafer may allow a more uniform distribution of the forward voltage of the Schottky-diodes formed on a batch, a loss or a larger quantity of semiconductor wafers according to the proposed concept.

The semiconductor wafer on which the Schottky-diode is formed may in some embodiments comprise a drift layer as top layer (e.g. a semiconductor layer which comprises a significantly lower concentration of dopants (of a same conductivity type) compared to a second semiconductor layer formed on a back surface of the drift layer).

The forward voltage of a Schottky-diode may be approximated according to $$V_F(I_{NOM}) = V_{TH} + R_{DIFF} * I_{NOM} \quad (1),$$

with $V_F$ denoting the forward voltage, $I_{NOM}$ denoting a nominal current applied to the Schottky-diode, $V_{TH}$ denoting a threshold voltage of the Schottky-diode (at which the diode begins conducting electricity) and $R_{DIFF}$ denoting the differential resistance of the Schottky-diode at the nominal current.

For example, the forward voltage depends on the threshold voltage $V_{TH}$ and the differential resistance $R_{DIFF}$. The differential resistance $R_{DIFF}$ depends on the dopant concentration in the drift layer and the thickness of the drift layer. Dopant concentration and thickness may vary according to the manufacturing process for the drift layer. For example, the thickness of the drift layer may vary within a few percent while the dopant concentration may vary by ten to twenty percent for an epitaxial manufacturing process. For example, the differential resistance $R_{DIFF}$ may be different for different wafers. Accordingly, the forward voltage $V_F$ may be different for two Schottky-diodes formed on two different wafers if the threshold voltage $V_{TH}$ is constant.

For example, the threshold voltage $V_{TH}$ depends on the Schottky-barrier of the Schottky-contact generated between the semiconductor wafer and the electrically conductive layer formed on the semiconductor wafer. Accordingly, the variation of the differential resistance $R_{DIFF}$ among the plurality of semiconductor wafers may be compensated by adjusting the threshold voltage $V_{TH}$ for each wafer individually (e.g. by adjusting the Schottky-barrier of the Schottky-contact).

The Schottky-barrier may be adjusted by individually selecting the material composition of the electrically conductive layer formed on the semiconductor wafer based on the value of the physical property of the semiconductor wafer, for example. For example, a partial pressure of nitrogen (e.g. a nitrogen flow) in a sputtering process may be selected to adjust the Schottky-barrier individually for a semiconductor wafer.

In some embodiments, a temperature dependency of the differential resistance $R_{DIFF}$ and the threshold voltage $V_{TH}$ may be considered. For example, the Schottky-barrier (e.g. the threshold voltage $V_{TH}$) may be adjusted such that the forward voltage $V_F$ of the Schottky-diode reaches a predefined value when a predefined nominal current $I_{NOM}$ is applied to the diode at a predefined operational temperature of the diode (e.g. an operational temperature $T_{OPERATION}$~100° C.). For example, the Schottky-barrier is adjusted such for the individual semiconductor wafer that variations among the plurality of semiconductor wafers are compensated.

For example, the material composition of the electrically conductive layer formed on the first semiconductor wafer and the material composition of the electrically conductive layer formed on the second semiconductor wafer may be selected such that an average forward voltage of the Schottky-diodes formed on the first semiconductor wafer differs less than 2%, 3%, 4%, 5%, 6% or 7% from an average forward voltage of the Schottky-diodes formed on the second semiconductor wafer.

For example, a more uniform distribution of the forward voltage at defined operational conditions of the Schottky-diodes formed on a batch, a loss or a larger quantity of semiconductor wafers may be achieved. In particular, a more uniform distribution of the forward voltage at a defined nominal current and a defined operational temperature of the Schottky-diodes formed on a batch, a less or a larger quantity of semiconductor wafers may be achieved.

More details and aspects are mentioned in connection with the embodiments described below. The embodiment illustrated in FIG. 1 may comprise one or more additional optional features corresponding to one or more aspects of the proposed concept or one or more examples described below.

Figure 2:
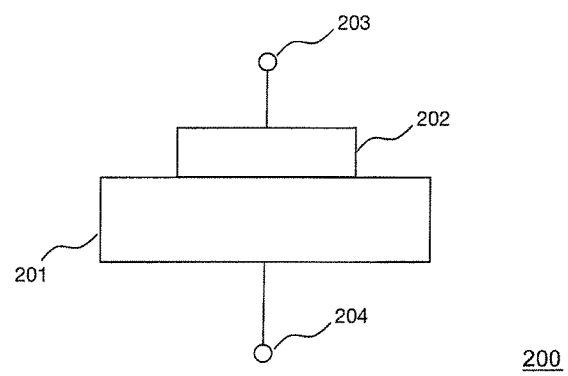
FIG. 2 illustrates an example of a semiconductor device.

FIG. 2 illustrates an example of a semiconductor device 200. The semiconductor device 200 comprises a semiconductor layer 201 and a conductive layer 202 formed on a surface of the semiconductor layer 201. The conductive layer 202 may be formed directly on the surface of the semiconductor layer 201. For example, no further layer may be formed between the semiconductor layer 201 and the conductive layer 202. The semiconductor layer 201 and the conductive layer 202 form a Schottky-contact. Hence, the semiconductor device 200 may be any device comprising a Schottky-contact. For example, the semiconductor device 200 may be a Schottky-diode.

Ohmic contacts 203 and 204 are provided to connect the semiconductor device 200 with further electronic components.

In some embodiments, the semiconductor device 200 may be formed according to one or more of the aspects described above or below. The embodiment of a semiconductor device illustrated in FIG. 2 may comprise one or more additional optional features corresponding to one or more aspects of the proposed concept or one or more examples described above or below.

Figure 3:
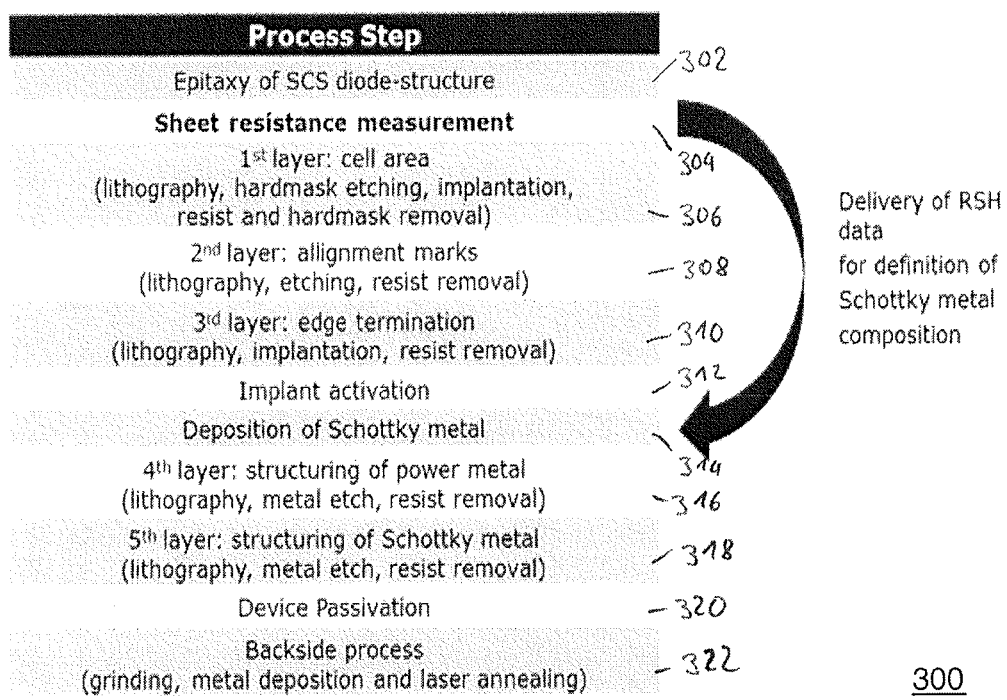
FIG. 3 illustrates a flowchart of a method for forming a plurality of semiconductor diodes.

FIG. 3 illustrates a flowchart of an embodiment of a method 300 for forming a plurality of semiconductor diodes.

The method 300 comprises forming 302 a structure of a diode (e. g. a structure of a Surge-Current-Stable (SCS) diode). For example, forming 302 the diode structure may comprises forming a semiconductor structure comprising one or more layers of doped or un-doped semiconductor material on a carrier wafer via one or more epitaxial processes. For example, the diode structure may be provided as a semiconductor wafer.

Further, the method 300 comprises measuring 302 the sheet resistance of the diode structure. The measure value for the sheet resistance may be stored so that the information is available for subsequent processes. Alternatively, a dopant concentration of one or more layers and/or a thickness of the one or more layers may be measured. A layer for measurement may, e.g., be a weakly doped semiconductor layer of the semiconductor wafer, which serves as a drift layer for the diode. For example, secondary ion mass spectrometry, capacitance-voltage spectrometry or cross-section analysis may be used for measurement. The measure values may be stored in order to be available for subsequent processes.

The method 300 further comprises processes 306 to 310 for defining individual diodes on the semiconductor wafer. The processes 306 to 310 may include lithographic processes, etching processes and ion implantation processes to achieve a desired doping profile.

Further, the method 300 comprises activating 312 the implanted ions. For example, the semiconductor wafer may be heated to temperatures of, e.g., 1300° C., 1500° C. or 1700° C., 1900° C. for defined time intervals.

Deposition 314 of an electrically conductive layer is performed subsequent to the activation of the implanted ions. The material composition (Schottky-metal) of the electrically conductive layer for the semiconductor wafer is selected based on the value measured by the measuring step 302. For example, the material composition may be selected according to the sheet resistance of the semiconductor wafer or a dopant concentration of one or more layers and/or a thickness of the one or more layers. The material composition of the Schottky-metal may thus be selected according to parameters of the one or more epitaxial processes. For example, the Schottky-metal may be deposited via a sputter process (e.g. MoN may be deposited via the sputter process). The Schottky-barrier of the Schottky-contact generated between the semiconductor wafer and the Schottky-metal may be selected or adjusted by selecting or adjusting a nitrogen flow or a partial pressure of nitrogen in the sputter gas. Selecting or adjusting a nitrogen flow or a partial pressure of nitrogen in the sputter gas may allow to adjust or select the concentration of nitrogen of the deposited MoN. For example, the Schottky-barrier of the Schottky-contact may be adjusted within a range of several hundred meV.

The method 300 comprises further structuring 316 a power metal serving as ohmic contact of the diode for connection to other electrical devices. Also structuring 318 the Schottky-metal (e.g. the electrically conductive layer formed on the semiconductor wafer) is comprised by method 300. Both structuring processes may comprises lithographic processes and etching processes to achieve a desired structure.

Further, the method 300 comprises passivating 320 the device. For example, a thin inert film may be deposited on the diodes formed on the semiconductor wafer. Passivation may enhance electrical characteristics of the diodes and protect the diodes from environmental factors.

Subsequently, the method 300 comprises backside processing 322. Backside processing 322 may comprise grinding processes (e.g., thinning or removing of the carrier wafer), metal deposition processes to form an ohmic contact at the backside of the semiconductor diode, and/or laser annealing processes to activate implanted ions at the backside of the device.

The method 300 may allow to individually adjust the Schottky-barrier of the Schottky-contact between the semiconductor wafer and the Schottky-metal for a wafer. Accordingly, variations among the plurality of semiconductor wafers related to the manufacturing process (e.g. related to epitaxial processes) may be compensated. Therefore, the method 300 may enable a more uniform distribution of the forward voltage of the Schottky-diodes formed on a batch, a less or a larger quantity of semiconductor wafers.

More details and aspects are mentioned in connection with the embodiments described above or below. The embodiment illustrated in FIG. 3 may comprise one or more additional optional features corresponding to one or more aspects of the proposed concept or one or more examples described above (e.g. FIG. 1 or FIG. 2) or below.

Some embodiments relate to adjusting the Schottky-barrier as a function of drift layer parameters via a feed-forward loop for homogenizing the forward voltage of Schottky-diodes. The known values for the dopant concentration and the thickness of the drift layer may be provided to the deposition process for the Schottky-material (e.g. the values may be provided to the deposition tool via a feed-forward loop). The Schottky-barrier may thus be customized for the individual wafer. Accordingly, a homogeneity within the manufacturing process of the diodes may be increased.

Figure 4:
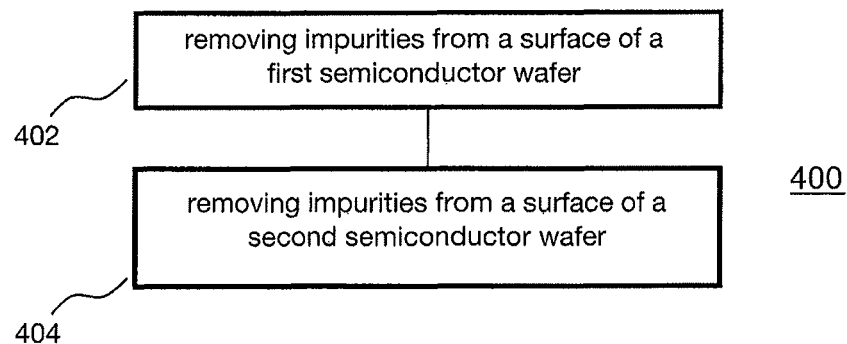
FIG. 4 illustrates a flowchart of another method for forming a plurality of semiconductor devices on a plurality of semiconductor wafers.

FIG. 4 illustrates a flowchart of an embodiment of a method 400 for forming a plurality of semiconductor devices on a plurality of semiconductor wafers.

The method 400 comprises removing 402 impurities from a surface of a first semiconductor wafer by a back sputter process applied to the surface of the first semiconductor wafer. A process time of the back sputter process applied to the surface of the first semiconductor wafer is selected based on a value of a physical property of the first semiconductor wafer.

The method 400 further comprises removing 404 impurities from a surface of a second semiconductor wafer by a back sputter process applied to the surface of the second semiconductor wafer. A process time of the back sputter process applied to the surface of the second semiconductor wafer is selected based on a value of the physical property of the second semiconductor wafer.

The process time of the back sputter process applied to the surface of the first semiconductor wafer is different from the process time of the back sputter process applied to the surface of the second semiconductor wafer, and so on.

Impurities on the semiconductor wafer may be impurity atoms like oxygen (e.g. a native $SiO_2$ layer) or chemical compounds which deposited on the surface of the semiconductor wafer. The back sputter process may allow to remove at least part or almost all impurities from the surface of the semiconductor wafer before the electrically conductive layer is formed on the surface. A process time of the back sputter process may be selected based on the value of the physical property of the semiconductor wafer. Selecting the process time (e.g. a time interval during which particles or ions are accelerated onto the surface of the semiconductor wafer) may allow to select a degree of purification (e.g. a fraction of impurities that is removed from the surface of the semiconductor wafer). For example, removing impurities may allow to adjust an electrical characteristic of the semiconductor device (e.g. a height of a Schottky-barrier of a Schottky-contact formed between the semiconductor wafer and a conductive layer formed on a surface of the semiconductor wafer).

The physical property of the semiconductor wafer is a property suitable for indicating variations of desired physical or electrical characteristics among the plurality of semiconductor wafers. For example the physical property of the first semiconductor wafer may be a thickness of the first semiconductor wafer (e.g. a vertical extension of the semiconductor wafer). In some embodiments, a thickness of a single layer out of plural layers of the semiconductor wafer may be used as physical property (e.g. a thickness of an epitaxial layer at a front surface of the semiconductor wafer). Also a combined or weighted thickness of more than one layer of plural layers of the semiconductor wafer may be used as physical property. Alternatively, the physical property may be a dopant concentration of the semiconductor wafer, a dopant concentration of a layer (e.g. an epitaxial layer at a front surface of the semiconductor wafer) of the semiconductor wafer or a combined or weighted dopant concentration of more than one layer out of plural semiconductor layers of the semiconductor wafer. For example, the dopant concentration may be an average concentration of dopants within the semiconductor wafer, within the layer of the semiconductor wafer or within the more than one layers of the semiconductor wafer. In some embodiments, the physical property of the first semiconductor wafer may be a sheet resistance of the semiconductor wafer (e.g. a resistance of the semiconductor wafer that is substantially invariable under scaling of the measuring contact). Alternatively or additionally, combinations of physical properties of the semiconductor wafer may be used to characterize the semiconductor wafer.

The value of the physical property may be known for the first and/or the second the semiconductor wafer (e.g. for all semiconductor wafers of the plurality of semiconductor wafers). For example, a manufacturer of the semiconductor wafer may provide values of the physical property for the provided semiconductor wafers. In some embodiments, the method may comprise determining (measuring) the value of the physical property of the semiconductor wafer. For example, a common four-point probe measurement or an indirect measurement using a non-contact eddy current may be used to determine a value of the semiconductor wafer's sheet resistance. For determining the thickness of the semiconductor wafer or the thickness of a layer of the semiconductor wafer as well as for determining a dopant concentration of the semiconductor wafer or a dopant concentration of a layer of the semiconductor wafer various measuring techniques may be used. For example, secondary ion mass spectrometry, capacitance-voltage spectrometry or cross-section analysis may be used to determine values of the thickness of the semiconductor wafer, the thickness of a layer of the semiconductor wafer, a dopant concentration of the semiconductor wafer or a dopant concentration of a layer of the semiconductor wafer.

The method 400 may optionally comprise forming an electrically conductive layer on the surface of the first semiconductor wafer so that a Schottky-contact is generated between the electrically conductive layer for the first semiconductor wafer and the first semiconductor wafer. Further, the method 400 may comprise forming an electrically conductive layer on the surface of the second semiconductor wafer so that a Schottky-contact is generated between the electrically conductive layer formed on the second semiconductor wafer and the second semiconductor wafer. In some embodiments a material composition of the electrically conductive layer formed on the first semiconductor wafer may be selected based on the value of the physical property of the first semiconductor wafer. A material composition of the electrically conductive layer formed on the second semiconductor wafer may be selected based on the value of the physical property of the second semiconductor wafer. Examples of processes for depositing an electrically conductive layer on a semiconductor wafer are discussed in connection with the method illustrated in FIG. 1.

Removing impurities from the surface of the semiconductor wafer (e.g. the contact surface for the Schottky-contact) may allow to adjust the Schottky-barrier of the Schottky-contact. The different process times for the back sputter processes for the first semiconductor wafer and the second semiconductor wafer may allow to individually adjust the Schottky-barrier of the Schottky-contact generated between the electrically conductive layer formed on the first semiconductor wafer and the first semiconductor wafer and the Schottky-barrier of the Schottky-contact generated between the electrically conductive layer formed on the second semiconductor wafer and the second semiconductor wafer. Adjusting the Schottky-barrier of the Schottky-contact individually for each semiconductor wafer may allow to compensate for variations among the plurality of semiconductor wafers. For example, the value of the physical property may indicate variations among the plurality of semiconductor wafers. Adjusting the Schottky-barrier of the Schottky-contact individually for each semiconductor wafer may allow a more uniform distribution of device characteristics of the semiconductor devices formed on a batch, a less or a larger quantity of semiconductor wafers.

Additionally, the sputter gas used for back sputter process may be selected based on the value of the physical property of the semiconductor wafer. For example, inert gases like helium (He), neon (Ne), argon (Ar), krypton (Kr) or xenon (Xe), or fluorine (F) may be used as sputter gas. The selected inert gas may affect the power of the back sputter process (e.g. a fraction of impurities that is removed from the surface of the semiconductor wafer). Accordingly, individually selecting the sputter gas for the back sputter process may allow to adjust the Schottky-barrier of the Schottky-contact for the individual semiconductor wafer.

More details and aspects are mentioned in connection with the embodiments described above or below. The embodiment illustrated in FIG. 4 may comprise one or more additional optional features corresponding to one or more aspects of the proposed concept or one or more examples described above (e.g. FIGS. 1 to 3) or below.

Figure 5:
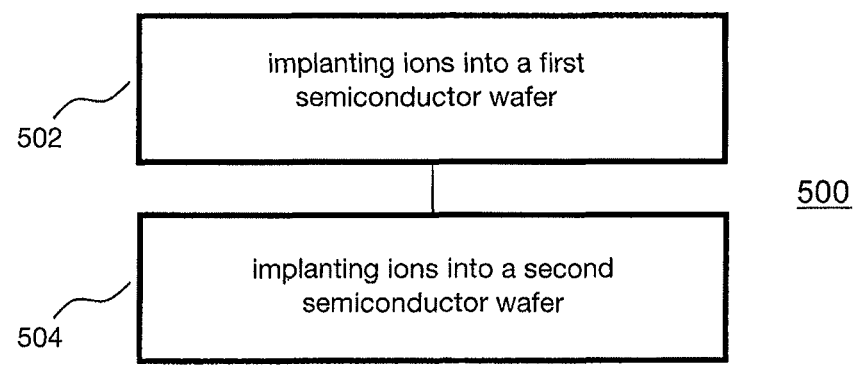
FIG. 5 illustrates a flowchart of another method for forming a plurality of semiconductor devices on a plurality of semiconductor wafers.

FIG. 5 illustrates a flowchart of an embodiment of a method 500 for forming a plurality of semiconductor devices on a plurality of semiconductor wafers.

The method 500 comprises implanting 502 ions into a first semiconductor wafer. A concentration of the ions implanted into the first semiconductor wafer is selected based on a value of a physical property of the first semiconductor wafer.

The method 500 further comprises implanting 504 ions into a second semiconductor wafer. A concentration of the ions implanted into the second semiconductor wafer is selected based on a value of the physical property of the second semiconductor wafer.

The concentration of the ions implanted into the first semiconductor wafer is different from the concentration of the ions implanted into the second semiconductor wafer.

Individually implanting ions based on the physical property of a semiconductor wafer of the plurality of semiconductor devices may allow to compensate variations among the plurality of semiconductor wafers. For example, a dopant concentration of a semiconductor wafer of the plurality of semiconductor devices or a dopant concentration of a layer of a semiconductor wafer of the plurality of semiconductor devices may vary among the plurality of semiconductor wafers (e.g. due to the manufacturing process). Also other parameters like a thickness of a semiconductor wafer of the plurality of semiconductor devices or a thickness of a layer of a semiconductor wafer of the plurality of semiconductor devices may vary among the plurality of semiconductor wafers (e.g. due to the manufacturing process).

The physical property of the semiconductor wafer is a property suitable for indicating variations of desired physical or electrical characteristics among the plurality of semiconductor wafers. For example the physical property of the first semiconductor wafer may be a thickness of the first semiconductor wafer (e.g. a vertical extension of the semiconductor wafer). In some embodiments, a thickness of a single layer out of plural layers of the semiconductor wafer may be used as physical property (e.g. a thickness of an epitaxial layer at a front surface of the semiconductor wafer). Also a combined or weighted thickness of more than one layer of plural layers of the semiconductor wafer may be used as physical property. Alternatively, the physical property may be a dopant concentration of the semiconductor wafer, a dopant concentration of a layer (e.g. an epitaxial layer at a front surface of the semiconductor wafer) of the semiconductor wafer or a combined or weighted dopant concentration of more than one layer out of plural semiconductor layers of the semiconductor wafer. For example, the dopant concentration may be an average concentration of dopants within the semiconductor wafer, within the layer of the semiconductor wafer or within the more than one layers of the semiconductor wafer. In some embodiments, the physical property of the first semiconductor wafer may be a sheet resistance of the semiconductor wafer (e.g. a resistance of the semiconductor wafer that is substantially invariable under scaling of the measuring contact). Alternatively or additionally, combinations of physical properties of the semiconductor wafer may be used to characterize the semiconductor wafer.

The value of the physical property may be known for the first and/or the second the semiconductor wafer (e.g. for all semiconductor wafers of the plurality of semiconductor wafers). For example, a manufacturer of the semiconductor wafer may provide values of the physical property for the provided semiconductor wafers. In some embodiments, the method may comprise determining (measuring) the value of the physical property of the semiconductor wafer. For example, a common four-point probe measurement or an indirect measurement using a non-contact eddy current may be used to determine a value of the semiconductor wafer's sheet resistance. For determining the thickness of the semiconductor wafer or the thickness of a layer of the semiconductor wafer as well as for determining a dopant concentration of the semiconductor wafer or a dopant concentration of a layer of the semiconductor wafer various measuring techniques may be used. For example, secondary ion mass spectrometry, capacitance-voltage spectrometry or cross-section analysis may be used to determine values of the thickness of the semiconductor wafer, the thickness of a layer of the semiconductor wafer, a dopant concentration of the semiconductor wafer or a dopant concentration of a layer of the semiconductor wafer.

The method 500 may optionally comprise forming an electrically conductive layer on the surface of the first semiconductor wafer so that a Schottky-contact is generated between the electrically conductive layer formed on the first semiconductor wafer and the first semiconductor wafer. Further, the method 500 may comprise forming an electrically conductive layer on the surface of the second semiconductor wafer so that a Schottky-contact is generated between the electrically conductive layer formed on the second semiconductor wafer and the second semiconductor wafer. Material compositions of the electrically conductive layers formed on the first and the second semiconductor wafer may be selected based on the value of the physical property of the first and the second semiconductor wafer, respectively. Examples of processes for depositing an electrically conductive layer on a semiconductor wafer are discussed in connection with the method illustrated in FIG. 1.

Individually selecting or adjusting the concentration of implanted ions may allow to individually adjust a Schottky-barrier of the Schottky-contact generated between the electrically conductive layer formed on the first semiconductor wafer and the first semiconductor wafer and a Schottky-barrier of the Schottky-contact generated between the electrically conductive layer formed on the second semiconductor wafer and the second semiconductor wafer. Adjusting the Schottky-barrier of the Schottky-contact individually for each semiconductor wafer may allow to compensate for variations among the plurality of semiconductor wafers. For example, the value of the physical property may indicate variations among the plurality of semiconductor wafers. Adjusting the Schottky-barrier of the Schottky-contact individually for each semiconductor wafer may allow a more uniform distribution of device characteristics of the semiconductor devices formed on a batch, a less or a larger quantity of semiconductor wafers.

The method 500 may optionally comprise annealing processes or activation processes for distributing the implanted ions within the semiconductor wafer and for activating the implanted ions.

Optionally, the method 500 may comprise removing impurities from the surface of the first semiconductor wafer by a back sputter process applied to the surface of the first semiconductor wafer. Further, the method 500 may comprise removing impurities from the surface of the second semiconductor wafer by a back sputter process applied to the surface of the second semiconductor wafer. The above two processes may be performed before forming the electrically conductive layer formed on the first semiconductor wafer and forming the electrically conductive layer formed on the second semiconductor wafer, respectively. Process times of the back sputter processes applied to the surface of the first and the second semiconductor wafer may be selected based on a value of the physical property of the first and the second semiconductor wafer, respectively. Examples of back sputter processes are discussed in connection with the method illustrated in FIG. 4.

Removing impurities from the surface of a semiconductor wafer of the plurality of semiconductor wafers may allow to adjust an electrical characteristic of the semiconductor device (e.g. a height of a Schottky-barrier of a Schottky-contact formed between the semiconductor wafer and a conductive layer formed on a surface of the semiconductor wafer).

More details and aspects are mentioned in connection with the embodiments described above. The embodiment illustrated in FIG. 5 may comprise one or more additional optional features corresponding to one or more aspects of the proposed concept or one or more examples described above (e.g. FIGS. 1 to 4).

Example embodiments may further provide a computer program having a program code for performing one of the above methods, when the computer program is executed on a computer or processor. A person of skill in the art would readily recognize that steps of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a plurality of semiconductor devices on a plurality of semiconductor wafers, the method comprising:
   forming an electrically conductive layer on a surface of a first semiconductor wafer so that a Schottky-contact is generated between the electrically conductive layer formed on the first semiconductor wafer and the first semiconductor wafer
   forming a plurality of Schottky-diodes on the first semiconductor wafer from the Schottky-contact generated between the electrically conductive layer formed on the first semiconductor wafer and the first semiconductor wafer;
   forming an electrically conductive layer on a surface of a second semiconductor wafer so that a Schottky-contact is generated between the electrically conductive layer formed on the second semiconductor wafer and the second semiconductor wafer,
   forming a plurality of Schottky-diodes on the second semiconductor wafer from the Schottky-contact generated between the electrically conductive layer formed on the second semiconductor wafer and the second semiconductor wafer;

wherein forming an electrically conductive layer on a surface of a second semiconductor wafer comprises:
obtaining a measurement of a value of a physical property of the second semiconductor wafer different from a value of a physical property of the first semiconductor wafer; and
selecting, based on the value of the physical property of the second semiconductor wafer, a material composition for the electrically conductive layer for the second semiconductor wafer different from a material composition of the electrically conductive layer of the first semiconductor wafer.

2. The method of claim 1, wherein the material composition of the electrically conductive layer formed on the first semiconductor wafer and the material composition of the electrically conductive layer formed on the second semiconductor wafer comprise at least one same component.

3. The method of claim 1, wherein a portion of at least one component of the material composition of the electrically conductive layer formed on the first semiconductor wafer differs by at least 5% from a portion of the component in the material composition of the electrically conductive layer formed on the second semiconductor wafer.

4. The method of claim 1, wherein a first material composition of the electrically conductive layer formed on the first semiconductor wafer is selected for a first value of the physical property of the first semiconductor wafer and a second material composition of the electrically conductive layer formed on the second semiconductor wafer different from the first material composition is selected for a second value of the physical property, the second value of the physical property being different from the first value of the physical property.

5. The method of claim 1, wherein semiconductor devices formed on the first semiconductor wafer are substantially equal to semiconductor devices formed on the second semiconductor wafer.

6. The method of claim 1, wherein the physical property is at least one of a thickness, a thickness of a layer, a dopant concentration, a dopant concentration of a layer and a sheet resistance of a semiconductor wafer.

7. The method of claim 1, wherein the method further comprises determining a value of the physical property of the first semiconductor wafer.

8. The method of claim 1, wherein the material composition of the electrically conductive layer formed on the first semiconductor wafer comprises an alloy of two or more metal elements, a composition comprising a metal element and a non-metal element or a composition comprising a metal element, a semiconductor element and a non-metal element.

9. A method for forming a plurality of semiconductor devices on a plurality of semiconductor wafers, the method comprising:
forming an electrically conductive layer on a surface of a first semiconductor wafer so that a Schottky-contact is generated between the electrically conductive layer formed on the first semiconductor wafer and the first semiconductor wafer, wherein a material composition of the electrically conductive layer formed on the first semiconductor wafer is selected based on a value of a physical property of the first semiconductor wafer; and
forming an electrically conductive layer on a surface of a second semiconductor wafer so that a Schottky-contact is generated between the electrically conductive layer formed on the second semiconductor wafer and the second semiconductor wafer, wherein a material composition of the electrically conductive layer formed on the second semiconductor wafer is selected based on a value of the physical property of the second semiconductor wafer,
wherein the material composition of the electrically conductive layer formed on the second semiconductor wafer is different from the material composition of the electrically conductive layer formed on the first semiconductor wafer,
wherein the electrically conductive layer formed on the first semiconductor wafer comprises nitrogen, and wherein a concentration of nitrogen of the electrically conductive layer formed on the first semiconductor wafer is selected based on the value of the physical property of the first semiconductor wafer.

10. The method of claim 9, wherein forming the electrically conductive layer formed on the first semiconductor wafer comprises a sputter process using a sputter gas containing nitrogen, and wherein the concentration of nitrogen in the electrically conductive layer formed on the first semiconductor wafer is selected by adjusting a partial pressure of nitrogen in the sputter gas.

11. The method of claim 1, wherein the material composition of the electrically conductive layer formed on the first semiconductor wafer and the material composition of the electrically conductive layer formed on the second semiconductor wafer are selected such that a Schottky-barrier of the Schottky-contact between the electrically conductive layer formed on the first semiconductor wafer and the first semiconductor wafer differs by at least 5% from a Schottky-barrier of the Schottky-contact between the electrically conductive layer formed on the second semiconductor wafer and the second semiconductor wafer.

12. The method of claim 1, wherein the method further comprises purifying the surface of the first semiconductor wafer by a back sputter process before forming the electrically conductive layer formed on the first semiconductor wafer, wherein a process time of the back sputter process is selected based on the value of the physical property of the first semiconductor wafer.

13. The method of claim 1, wherein the semiconductor devices of the plurality of semiconductor devices on the plurality of semiconductor wafers are Schottky-diodes.

14. The method of claim 13, wherein the material composition of the electrically conductive layer formed on the first semiconductor wafer and the material composition of the electrically conductive layer formed on the second semiconductor wafer are selected such that an average forward voltage of the Schottky-diodes formed on the first semiconductor wafer differs less than 5% from an average forward voltage of the Schottky-diodes formed on the second semiconductor wafer.

15. The method of claim 1, further comprising:
removing impurities from the surface of the first semiconductor wafer by a back sputter process applied to the surface of the first semiconductor wafer before forming the electrically conductive layer on the surface of the first semiconductor wafer; and
removing impurities from the surface of the second semiconductor wafer by a back sputter process applied to the surface of the second semiconductor wafer before forming the electrically conductive layer on the surface of the second semiconductor wafer;
wherein a process time of the back sputter process applied to the surface of the first semiconductor wafer is different from a process time of the back sputter process applied to the surface of the second semiconductor wafer.

16. The method of claim 1, further comprising:
implanting ions into the first semiconductor wafer before forming the electrically conductive layer on the surface of the first semiconductor wafer; and
implanting ions into the second semiconductor wafer before forming the electrically conductive layer on the surface of the second semiconductor wafer;
wherein a concentration of the ions implanted into the first semiconductor wafer is different from a concentration of the ions implanted into the second semiconductor wafer.

17. The method of claim 1, wherein the electrically conductive layer formed on the first semiconductor wafer comprises nitrogen, and wherein a concentration of nitrogen of the electrically conductive layer formed on the first semiconductor wafer is selected based on a value of the physical property of the first semiconductor wafer.

18. The method of claim 17, wherein forming the electrically conductive layer formed on the first semiconductor wafer comprises a sputter process using a sputter gas containing nitrogen, and wherein the concentration of nitrogen in the electrically conductive layer formed on the first semiconductor wafer is selected by adjusting a partial pressure of nitrogen in the sputter gas.

* * * * *